June 19, 1962 J. T. FIGLIO ET AL 3,039,515

FABRICATION OF SEMICONDUCTOR DEVICES

Filed Feb. 24, 1959 2 Sheets-Sheet 1

INVENTORS
DONALD J. WEISEL
JOSEPH T. FIGLIO

BY

F. D. Pr[illegible]

ATTORNEY

INVENTORS
DONALD J. WEISEL
JOSEPH T. FIGLIO
BY
F D Prager
ATTORNEY

United States Patent Office 3,039,515

Patented June 19, 1962

3,039,515

FABRICATION OF SEMICONDUCTOR DEVICES

Joseph T. Figlio, Lansdale, and Donald J. Weisel, Chalfont, Pa., assignors, by mesne assignments, to Philco Corporation, Philadelphia, Pa., a corporation of Delaware Filed Feb. 24, 1959, Ser. No. 795,221
3 Claims. (Cl. 156—345)

This invention has to do with fabrication of semiconductor devices, such as transistors, and particularly with the etching of the electrode areas which are usually required. The etching of a semiconductor material is promoted by photoconductivity, that is, by applying light to the material during the etching thereof, and attempts have therefore been made to provide illumination of a semiconductor etching region by a cluster of lamps, disposed around and directed toward said region. The required illumination has been found to be fairly large. For instance, in order to form a typical etch pit, occupying an area of about a square millimeter, it was thus far necessary to use about one thousand watts of illuminating power, or sometimes more, which had to be provided by three or four projection lamps with reflectors focused onto the etch pit.

Such an arrangement, however, not only added to the operating cost but also led to serious difficulties. It often caused irregular etching; it always produced waste heat in inconvenient quantities; and it generally interfered with attempts to make the processing installation as small and manageable as is desired. The latter difficulties were especially serious in those frequent cases where several etching regions, of generally similar type, were required, either in series or in parallel; and the frequent occurrence of irregular etching of course has constituted a problem of fundamental importance.

It is the basic object of this invention to minimize all of these problems. A specific object is to obtain etching which is not only extremely rapid but also highly regular. Another specific object is to obtain efficient etching by compact equipment and with low dissipation of heat.

All of this has been found to be possible, and additional advantages have been obtained, as will appear hereinafter. This has been achieved by a system of remarkable simplicity. A preferred form of the new system may be characterized briefly as employing a single light source, of relatively small size and low wattage, in combination with a novel optical mounting which uniformly, symmetrically applies the light of said source to the etching region. In effect, there is formed a single cone of light, coaxial with a column of etching liquid and having an apex region at the solid-contacting end of said column.

Figure 2:
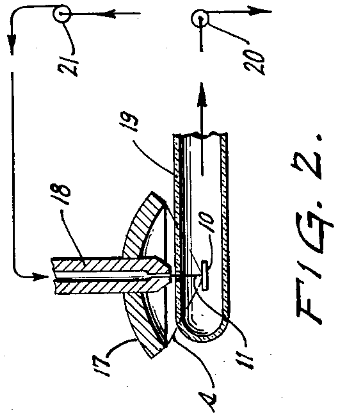
Figure 3:
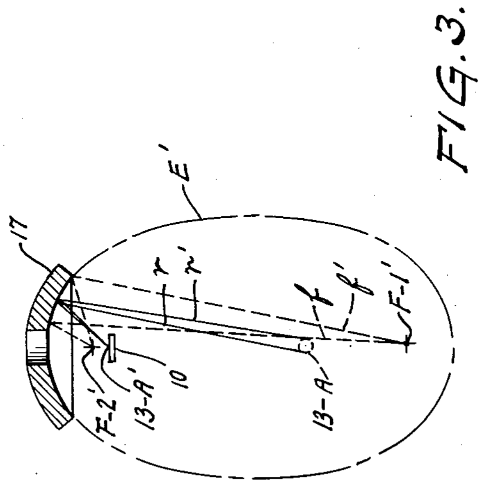
Figure 1:
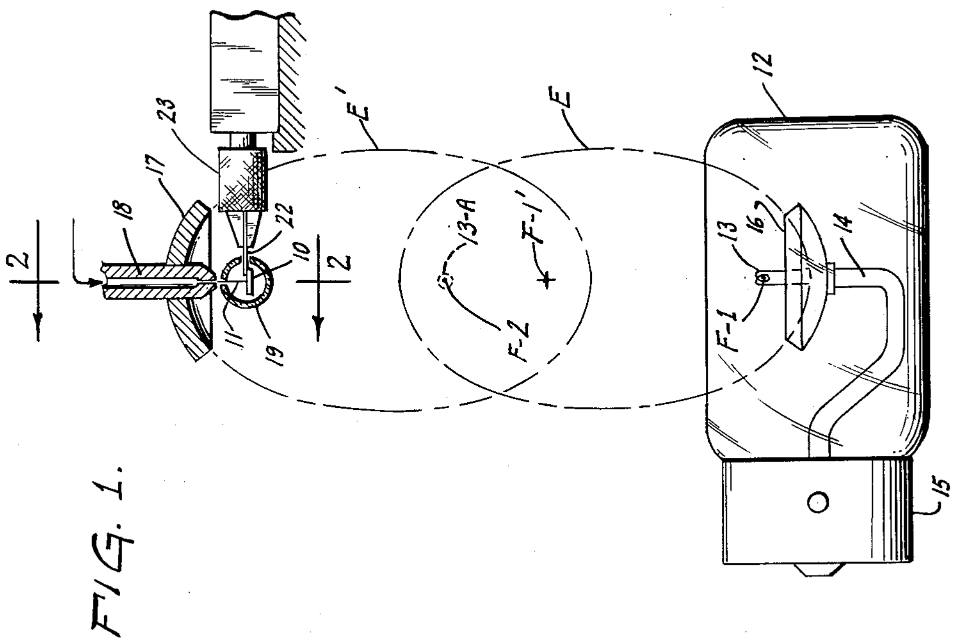
Figure 4:
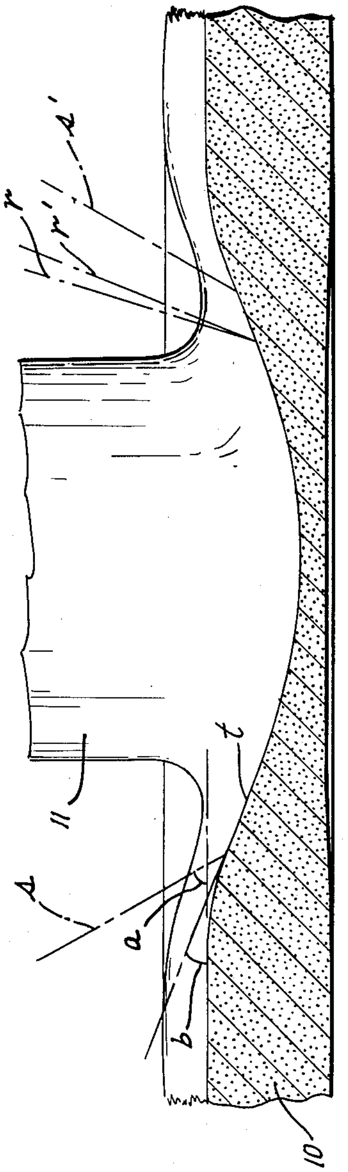
Figure 5:
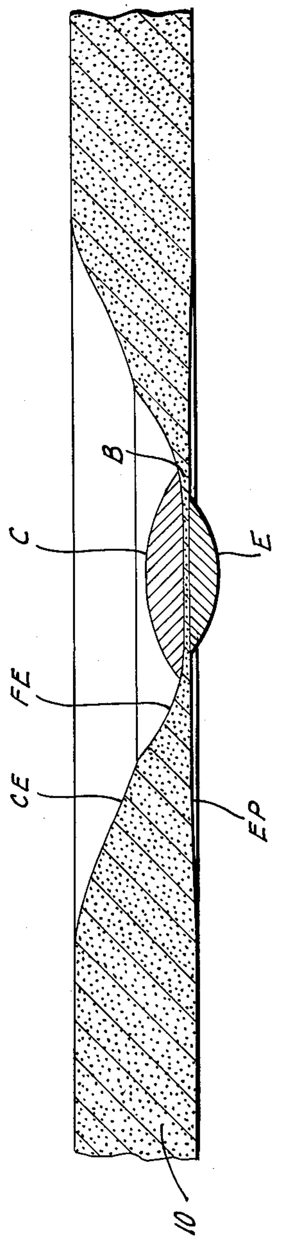

The advantages of the new system will be understood more thoroughly from the study of a preferred embodiment thereof, and such an embodiment is therefore schematically shown in the drawing appended hereto. FIGURE 1 is a side view, partly in section, of said embodiment. FIGURE 2 is a fragmentary section, taken along line 2—2 in FIGURE 1. FIGURE 3 is another fragmentary section, generally similar to an upper part of FIGURE 1, with certain parts removed, and providing further explanation of the parts shown. FIGURE 4 is a greatly enlarged detail, shown in central section. FIGURE 5 is a view generally similar to FIGURE 4 but showing central parts of a completed product of etching and electrode-forming operations.

Referring first to FIGURE 1: transistor wafer 10, which is here seen edgewise and approximately on a full scale, is exposed to etching with the aid of a thin liquid jet 11. This jet is desirably formed of a suitable, known chemical etchant, desirably of high strength. The jet accordingly causes rapid semiconductor etching, wherever intense photoconductivity is provided. An electrochemical etching agent may be used, instead of the chemical agent, by contacting the wafer and an electrolyte liquid with suitable electrode means, well known by themselves and not shown herein.

According to the invention, the etching region is made highly photoconductive, by coaxially illuminating it with concentrated light, emitted from a single lamp 12. Said lamp is installed below the etching region, by a support structure, not shown. It has an incandescent filament coil 13, which, as viewed from above, desirably forms a regular zig-zag pattern of approximately square outline. The ends of the coil are connected, by conductors 14, with a lamp socket 15, as usual; and the filament is symmetrically disposed around focal point F–1 of a first ellipsoidal mirror or reflector 16, this reflector being mounted, below the filament, within the envelope of the lamp. Outwardly of said envelope, and as shown above the same, this ellipsoidal reflector forms an approximately full-sized, real image 13–A of filament 13, in the plane of the second focus F–2 of the ellipsoidal reflector surface. The cross-section of said surface forms part of an ellipse, as shown by broken line E.

Opposite the first mirror 16, there is installed a second ellipsoidal mirror or reflector 17, desirably having elliptical cross-section E′, similar to E as to form and size. This second mirror is so spaced from mirror 16 as to form a secondary and final filament image, of reduced size, on the upper surface of blank 10, in the region of impact of jet 11. The first-mentioned image 13–A, accordingly, is used as an intermediary image or light source.

The second mirror 17 is disposed not only coaxially with foci F–1, F–2 of the first reflector, but also coaxially with a jet nozzle 18 which extends through this second mirror. This nozzle forms the etching jet column 11, so that the light, as ultimately reflected onto blank 10, forms a substantially solid "cone," symmetrically surrounding the jet. This "cone" is identified in FIGURE 2 by letter *s*. Only so much of a complete, solid "cone" of light is lacking as corresponds to the central region of reflector 17, where a substantially non-reflecting surface is interposed by the presence of nozzle 18.

The so defined cone of light enters the interior of a suction nozzle 19, for instance through a transparent side wall of said nozzle, as shown in said FIGURE 2. In the interior of the nozzle, the semiconductor blank 10 is supported, with the region to be etched upwardly presented to the jet nozzle. A suction pump, very schematically shown at 20, is connected to nozzle 19, while a pump 21 supplies etchant liquid to jet nozzle 16. As further shown in FIGURE 1, blank 10 is mounted on a tab 22, held by a suitably indexed transistor holder 23. The tab reaches into the interior of suction nozzle 19; for this purpose, in the installation as shown, a first opening is formed in the wall of said nozzle, while jet 11 enters the interior of the nozzle through another opening in said wall.

The elliptical curve E′ defining the surface of the second reflector 17 (FIGURE 3) has foci F–1′, F–2′, disposed in line with the foci of the other reflector so that intermediate source image 13–A lies directly between foci F–1′, F–2′. It will be seen that the two ellipses E, E′ are thus interlinked for imaging from a focal region of the first ellipse E, via interlinking regions, to a focal region of the second ellipse E′. Somewhat similar imaging has sometimes been used, in other fields, such as the design of certain lamps, furnaces and the like. According to one aspect of the present invention, however, imaging between focal regions is advantageously utilized in a modified way, as follows (FIGURES 1 and 3).

The interlinking foci F–1′ and F–2 of the two elliptical curvatures, as shown in FIGURE 1, are not coincident with one another, although such coincidence has been usual in the aforesaid lamps and furnaces. Rather, the interlinking focus F–2 of the first reflector 16 is disposed only adjacent to the interlinking focus F–1′ of the other reflector 17; F–2 and 13–A are, as mentioned, placed between the foci of said second reflector 17.

As a result, and as indicated by straight lines *r*, *r′* in FIGURE 3, the intermediate real image 13–A is imaged, with great reduction, in a plane lying between foci F–1′, F–2′ and adjacent the latter focus F–2′, thereby forming a reduced size, secondary image 13–A′ of the light source. While being very minute, the secondary image 13–A′ is of finite size. (It may also be mentioned that, as shown by lines *f*, *f′* in FIGURE 3, any object located at intermediate focus F–1′ would be imaged by the second reflector 17 at final focus F–2′. Such an image would not be reduced in size.)

As already mentioned, the secondary image 13–A′ is formed on the top surface of transistor 10. The way in which the light, arriving on this surface, is associated with the etching jet is best shown in FIGURE 4. While FIGURE 3 shows only a pair of arbitrarily selected light rays *r*, *r′*, emanating from intermediate image 13–A, in order to indicate the further imaging at 13–A′, FIGURE 4 also shows the marginal rays *s*, *s′* of the "cone" of light traveling from upper reflector 17 to transistor 10. Such marginal rays *s*, *s′* of the light cone surround and include the cylindrical liquid jet 11 in a substantially symmetrical arrangement.

For maintaining this substantially symmetrical arrangement, as shown, it is important that the short filament coil 13 (FIGURE 1) occupies a regular area, desirably a substantially square area, as viewed from above, wherein said coil is symmetrically disposed about focus F–1, as aforesaid. Thus the full-size image 13–A of the square filament coil area is formed not only in the plane of but symmetrically with intermediate focus F–2, leading to the equally symmetrical formation of a very much smaller, substantially square coil image, on the top surface of transistor 10, coaxially with jet liquid column 11.

Additionally, a high degree of symmetry of light flux intensity is obtained within the illuminated area itself, which as mentioned is an approximate square of rather minute size and wherein there is inscribed a zone of impact and most rapid flow of the jet liquid. The distribution of intensities of illuminance in this minute square area, and in the circle inscribed therein, is similar to the distribution of luminance values in the plane of the original light source; that is, said distribution is, as mentioned, substantially symmetrical about the axis of the optical system, and thus, according to the invention, with the axis of the etching jet.

As a result of these arrangements, individual portions of the illuminated and jet-treated circle, on the semiconductor surface, receive illumination of substantially uniform intensity, thereby producing substantially uniform photoconductivity in said several portions. The simultaneous presence of rapidly moving etchant liquid serves primarily to utilize such photoconductivity by rapid etching, and of course also to cool the semiconductor material, which would otherwise be liquefied and/or evaporated by the heat of the concentrated light cone. Thus a collector etch pit CE, FIGURE 5, is formed not only with great speed but also with high regularity and symmetry of form.

An equally symmetrical fine-etching pit FE can subsequently be formed, by similar operation with a thinner jet, not shown, in the bottom of collector etch pit CE and coaxially therewith; and in the center of this latter pit, a collector electrode C is ultimately formed. Similarly, an emitter electrode E is formed, on the opposite side of transistor 10, in a shallow emitter etch pit EP coaxial with pit FE. By virtue of the high regularity and symmetry of the etched-out cavities and of their surfaces, the new optical-hydraulic system, as described, leads to the formation of a transistor base B, between electrodes E and C, which cannot only be made extremely thin but which at the same time is defined by surface portions of smooth and highly regular form, resembling those of an extremely thin, precision-made lens. This form of base B, in turn, is advantageous in that it enables the transistor to operate efficiently at high frequencies.

This transistor is moreover formed very rapidly, economically and conveniently. A single lamp 12 of 150 watts rating, utilized in accordance with the invention, as shown in FIGURE 1, has provided photoconductivity more than equivalent to that which hitherto was generated by three or four lamps, having a total of about 1000 watts of rated lighting power, and disposed about the etching zone. Evidently not only the first cost and operating cost of the etching installation has thus been reduced, to a large extent, but the installation has also been made more compact and at the same time less conducive to troublesome waste heat, while remarkably improving the quality of the microscopic etching work and thus facilitating the production of high quality transistors.

It may finally be desirable to explain at least in general outline some features concerning the proportioning of the two ellipsoidal reflectors 16, 17 which have been provided instead of the previously used light collector systems surrounding the treatment area. In this connection it is important to consider the relatively detailed FIGURE 4, together with the more diagrammatic FIGURES 1 to 3. As best shown in FIGURE 4 all of the illumination provided by the single light cone confined between marginal rays *s*, *s′* reaches all transistor surface portions under a fairly steep angle, generally designated by letter *a*. If this angle *a* were made very small, large portions of the light would not be refracted into the solid material and would thus be wasted. In this connection it may further be noted that the general orientation of transistor surface *t* in the etch pit gradually assumes progressive inclinations *b*, during the etching process, so that the light reaches the transistor surface level at progressively flatter angles. It seems that during the etching process actual surface orientations of minute grains of semiconductor substance are subject to rapid change, thereby also changing angles of incidence of individual light rays and leading to a certain averaging out of such angles of incidence; however, it has still been found to be important that the said angles be kept fairly large, relative to the general orientation of the transistor surface, in order that the light may efficiently penetrate into such surface. Therefore, the angularity of marginal rays *s*, *s′* leading from the edge of the "aperture" of reflector 17 to the focal region 13–A′ (FIGURES 1 to 3) must be limited.

However, it will also be seen that the invention, at the same time, calls for collection of a large amount of light, from virtual image 13–A, and that it, by this latter consideration, in turn calls for the use of a relatively large "aperture" of said reflector 17, in accordance with well-known general principles of optics.

It is therefore desirable to strike a balance between (*a*) making ellipse E′ relatively short and wide, to obtain maximum brilliance of the final image 13–A′ and (*b*) making said ellipse long and narrow, to keep the angle of incidence of marginal rays *s*, *s′* relatively large. In practice it has been found that best results are obtained when the ratio of major to minor axes of ellipse E′ is generally of the aproximate order of two to one, as shown. For related, although not identical reasons, similar curvature E has been found desirable for primary reflector 16.

It will however be understood that many modifications are possible, for instance as to the proportioning and dimensioning of reflector curvatures and other elements. The invention, in the broader aspect thereof, should accordingly not be limited to the specific features illustrated and specifically described. The invention is claimed as follows.

We claim:

1. In apparatus for converting a surface portion of a semiconductive body into an electrode area by the combined influence of light illuminating said surface area and of liquid etchant directed through a discharge nozzle against said surface area, the improvement which comprises:

a source of said light disposed coaxially with said discharge nozzle and constructed and arranged to provide light flux intensities symmetrically distributed about the axis of said nozzle; and a light condensor of large size relative to said surface area and source of light, coaxially and symmetrically surrounding said nozzle and constructed and arranged to focus said light onto said surface portion of the small semiconductive body and to provide symmetrical distribution of light flux intensities over said surface portion impacted by said liquid etchant, whereby said surface portion can rapidly be converted into an electrode area of smooth and symmetrical form.

2. Apparatus as described in claim 1, wherein said light source is an incandescent lamp having its filament arranged symmetrically about said axis.

3. Apparatus as described in claim 1, wherein said light condensor is a curved reflector secured to and surrounding said nozzle.

References Cited in the file of this patent

UNITED STATES PATENTS

| | | |
|---|---|---|
| 1,897,219 | Schroter | Feb. 14, 1933 |
| 1,985,074 | Bauersfeld | Dec. 18, 1934 |
| 2,799,637 | Williams | July 16, 1957 |
| 2,841,477 | Hall | July 1, 1958 |
| 2,846,346 | Bradley | Aug. 5, 1958 |
| 2,930,949 | Roschen | Mar. 29, 1960 |

FOREIGN PATENTS

| | | |
|---|---|---|
| 401,591 | Great Britain | Nov. 16, 1933 |